US006902969B2

(12) United States Patent
Adetutu et al.

(10) Patent No.: US 6,902,969 B2
(45) Date of Patent: Jun. 7, 2005

(54) PROCESS FOR FORMING DUAL METAL GATE STRUCTURES

(75) Inventors: Olubunmi O. Adetutu, Austin, TX (US); Hsing H. Tseng, Austin, TX (US); Wei E. Wu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 10/632,473

(22) Filed: Jul. 31, 2003

(65) Prior Publication Data

US 2005/0026345 A1 Feb. 3, 2005

(51) Int. Cl.$^7$ .................................... H01L 21/8238
(52) U.S. Cl. .................. 438/199; 438/200; 438/216; 438/218; 438/233
(58) Field of Search ........................... 438/199, 200, 438/216, 218, 233

(56) References Cited

U.S. PATENT DOCUMENTS 6,492,217 B1 * 12/2002 Bai et al. .................... 438/199

2002/0151125 A1 * 10/2002 Kim et al. ................... 438/199

OTHER PUBLICATIONS

Adetutu, Olubunmi O., Process for Forming Dual Metal Gate Structures, U.S. Appl. No. 10/410,043, filed Apr. 9, 2003.

* cited by examiner

*Primary Examiner*—Long Pham
(74) *Attorney, Agent, or Firm*—Joseph P. Lally

(57) ABSTRACT

A semiconductor device has a P channel gate stack comprising a first metal type and a second metal type over the first metal type and an N channel gate stack comprising the second metal type in direct contact with a gate dielectric/etch stop layer stack. The N channel gate stack and the P channel gate stack are etched by a dry etch. Either the gate dielectric or etch stop can be in contact with the substrate. The etch stop layer prevents the dry etch of the first and second metal layers from etching through the gate dielectric and gouging the underlying substrate.

24 Claims, 3 Drawing Sheets

PROCESS FOR FORMING DUAL METAL GATE STRUCTURES

CROSS REFERENCE TO RELATED APPLICATIONS

The subject matter of the present application is related to the subject matter of patent application of Adetutu, et al., Ser. No. 10/410,043, filed Apr. 9, 2003, entitled Process for Forming Dual Metal Gate Structures.

FIELD OF THE INVENTION

This invention relates to making integrated circuits using metal gates, and more particularly, to making integrated circuits using metal gates of differing structures.

RELATED ART

As semiconductor devices continue to scale down in geometry, the conventional polysilicon gate is becoming inadequate. One problem is relatively high resistivity and another is depletion of dopants in the polysilicon gate in proximity to the interface between the polysilicon gate and gate dielectric. To overcome these deficiencies of polysilicon, metal gates are being pursued as an alternative. For desired functioning of the P channel transistors and the N channel transistors, the work functions of the metals used for the N channel and P channel transistors should be different. Thus, two different kinds of metals may be used as the metal directly on the gate dielectric. Metals that are effective for this application generally are not easily deposited or etched. Two metals that have been found to be effective are titanium nitride for the P channel transistors and tantalum silicon nitride for N channel transistors. The etchants typically used for these materials, however, are not sufficiently selective to the gate dielectric and silicon substrate thus gouging may occur in the silicon substrate. This arises because in the P channel active regions, the titanium nitride is under the tantalum silicon nitride. The etch process that is used for the removal of the tantalum silicon nitride over the P channel active regions is necessary to expose the titanium nitride for subsequent etching also exposes the gate dielectric in the N channel active regions. As a consequence, the etch of the titanium nitride is also applied to the exposed gate dielectric in the N channel active regions where source/drains are to be formed. This etch of the titanium nitride may have the adverse effect of also removing the exposed gate dielectric and gouging the underlying silicon where the source/drains are to be formed. It would be beneficial, therefore, to implement a process for forming dual gate transistors that addresses the described issues.

BRIEF DESCRIPTION OF THE DRAWINGS

The present invention is illustrated by way of example and not limited by the accompanying figures, in which like references indicate similar elements, and in which.

Figure 1:
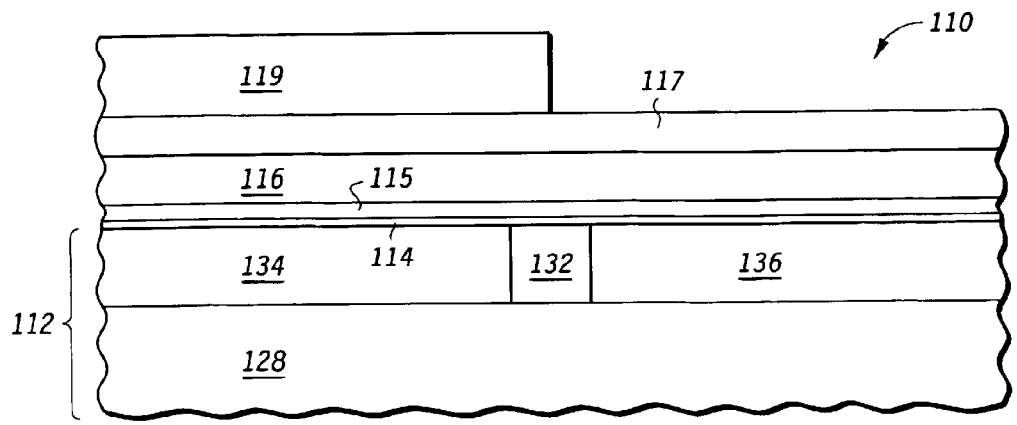
FIGS. 1–7 are cross sections of a semiconductor device according to one embodiment of the invention at selected stages in the fabrication process.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention contemplates a method and semiconductor structure that enables the manufacturing of an integrated circuit employing a first type of gate electrode for a first type of devices and a second type of gate electrode for a second type of devices. The invention addresses problems typically associated with dual gates structures, namely, poor selectively during the gate electrode etch process resulting in undesired etching and/or gouging of the gate dielectric and/or semiconductor substrate, by incorporating an etch stop layer that is highly selective to the dual gate etch species. The etch stop layer may be located directly on the semiconductor surface or directly on the gate dielectric layer. In either embodiment, the presence of the etch stop layer prevents the gate stack etch process from undesirably etching the underlying gate dielectric and wafer substrate.

Shown in FIG. 1A is a semiconductor device 110 comprising a semiconductor substrate 112, a gate dielectric 114 directly on a top surface of substrate 112, an etch stop layer 115 directly on gate dielectric 114, a layer 116 containing a first metal such as titanium nitride, a layer 117 of a dielectric such as TEOS, and a patterned layer 119 of photoresist. Substrate 112 as shown in FIG. 1A includes a N-doped region (N region) 134, a P-doped (P region) 136, and an isolation dielectric 132, over a bulk semiconductor portion 128. An alternative embodiment of substrate 112 is depicted in FIG. 1B. In this embodiment, substrate 112 is a silicon-on-insulator (SOI) substrate that includes a layer 126 of silicon-oxide or another dielectric between bulk semiconductor portion 128 and an N region 134, isolation region 132, and P region 136. The remaining drawings and accompanying text assume the non-SOI embodiment (FIG. 1A) of substrate 112, but it will be appreciated that the SOI substrate of FIB 1B may be used as an alternative.

As depicted in FIG. 1A, etch stop layer 115 is formed over gate dielectric 114. In an alternative embodiment, etch stop layer 115 contacts substrate 112 and gate dielectric 114 is formed on the top surface of etch stop layer 115. In this embodiment, gate dielectric layer 114 is likely formed by a deposition process whereas, in the depicted embodiment, gate dielectric 114 may be thermally formed (i.e., grown). Gate dielectric 114 is preferably a silicon and oxygen containing film and still more preferably a silicon oxynitride film. Etch stop layer 115 is preferably a non-conductive, high K metal oxide, metal-silicate, or metal-aluminate film such as hafnium oxide, hafnium silicate, hafnium aluminate, zirconium oxide, zirconium silicate, zirconium aluminate and the like. In one embodiment 15 Angstroms of hafnium oxide will act as an effective etch stop while adding less than 4 Angstroms of effective oxide thickness to the gate dielectric.

Figure 2:
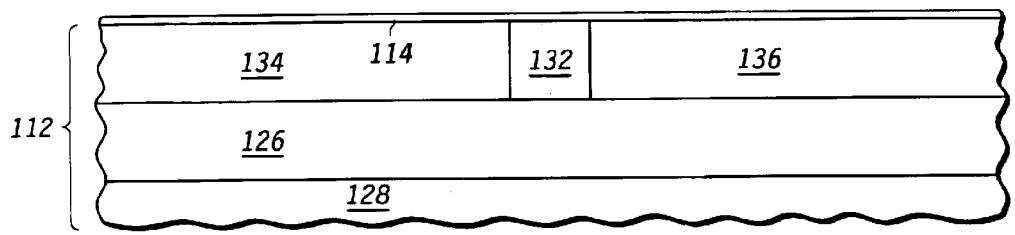
Figure 3:
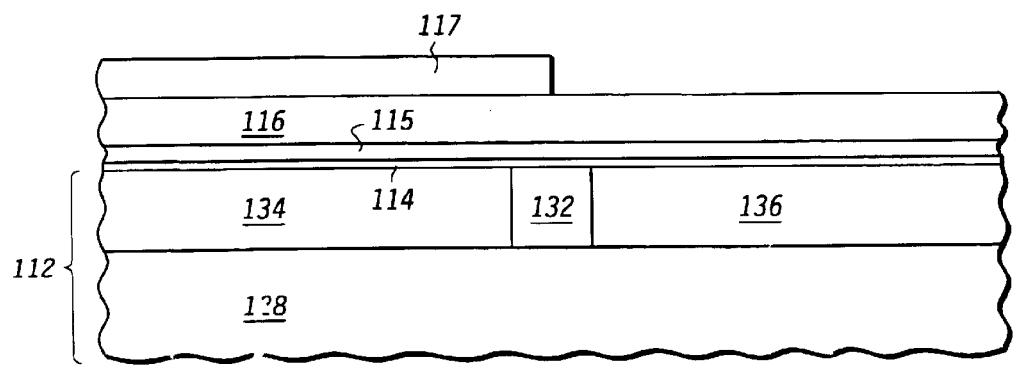

In FIG. 2, a portion of TEOS layer 117 over P region 136 is removed and the patterned photoresist layer 119 is stripped. In FIG. 3, the patterned TEOS layer 117 is used as an etch mask to pattern layer 116 of titanium nitride by removing portions of the layer over P region 136. In another embodiment, the patterned photoresist layer 119 is formed directly on titanium nitride layer 116 and is used as the titanium nitride etch mask without the intervening TEOS layer. The TEOS mask embodiment is suitable for use with a wet etch process that beneficially minimizes the impact on the underlying gate dielectric films while the photoresist mask is suitable for use with a dry etch process.

In the depicted embodiment, the etching of first metal layer 116 is achieved with a wet etch process. The wet etch may be a piranha clean, which is comprised of sulfuric acid and hydrogen peroxide in solution with water although other wet etches may also be effective. A piranha clean is particularly beneficial because it is commonly available in a fabrication facility and is thus well understood. Moreover, the piranha clean is very selective to silicon oxynitride as well as silicon oxide. Thus, there is minimal etching of gate dielectric 114 while removing the portions of layer 116 that are exposed to the piranha clean. This would also be true if gate dielectric 114 were silicon oxide.

Figure 4:
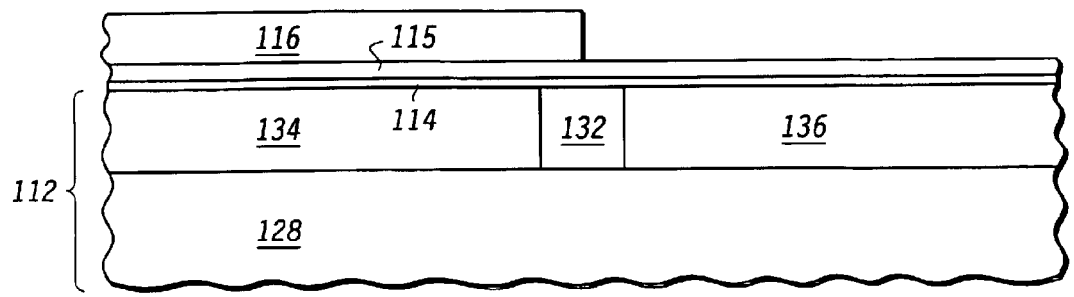

In FIG. 4, a layer 118 of a second metal such as tantalum silicon nitride, a layer 120 of polysilicon, an antireflective coating (ARC) layer 122 of silicon-rich silicon nitride, and patterned photoresist portions 124 and 126 have been formed over substrate 112. In the depicted embodiment, layer 116 overlies N region 134 but not region 136 and is in direct contact with etch stop layer 115. Layer 118 overlies substrate 112 including layer 116 and P region 136. Layer 120 overlies layer 118. Layer 122 overlies layer 120. Patterned photoresist portion 124 overlies a portion of N region 134 where a P channel gate stack is to be formed. Similarly patterned photoresist portion 126 overlies P region 136 where an N channel gate stack is to be formed.

At this point a dry etch is performed that does not penetrate through the etch stop layer 115. The etchants used in the dry etch processing likely include chlorine ($Cl_2$) and a fluorine-bearing compound such as $CF_4$ to etch layers 116 and 118. Because these etchants are not selective to silicon-oxide compounds (e.g., $SiO_2$, SiON) and because the metal thickness varies with the presence or absence of layer 118, the dry etch processing would likely etch into and through gate dielectric 114 over P region 136 (where metal layer 118 is absent) and gouge P region 136 before etching through fist metal layer 116 over N region 134 (where metal layer 118 is present). The presence of etch stop layer 115, to which the metal layer etchants are selective, prevents this undesirable result.

The thickness of layers 116 and 118 is preferably 50 Angstroms but could be as low as 30 Angstroms or could be higher than 50 Angstroms. The width of patterned photoresist portions 124 and 126, which is going to be used for determining the length of transistor gates, is preferably 500 Angstroms, about ten times the thickness of the metal layers 116 and 118 (the drawing is not to scale). The width of isolation region 132 is about the same as the width of patterned photoresist portions 124 and 126. These dimensions can be either smaller or larger depending on the particular technology that is being used. For example, lithography challenges may limit, in production, the minimum dimension for the patterned photoresist portions 124 and 126 to be only 500 Angstroms or even 1000 Angstroms but the thicknesses of layers 116 and 118 may still be held at 50 Angstroms. ARC layer 122 is preferably 200 Angstroms thick. Moreover the thickness of ARC layer 122 is preferably derived from the formula $\lambda/(2*(N-1))$ where $\lambda$ is wavelength of light used to pattern the gate electrode and N is the index of refraction of the ARC material at that wavelength.

Figure 5:
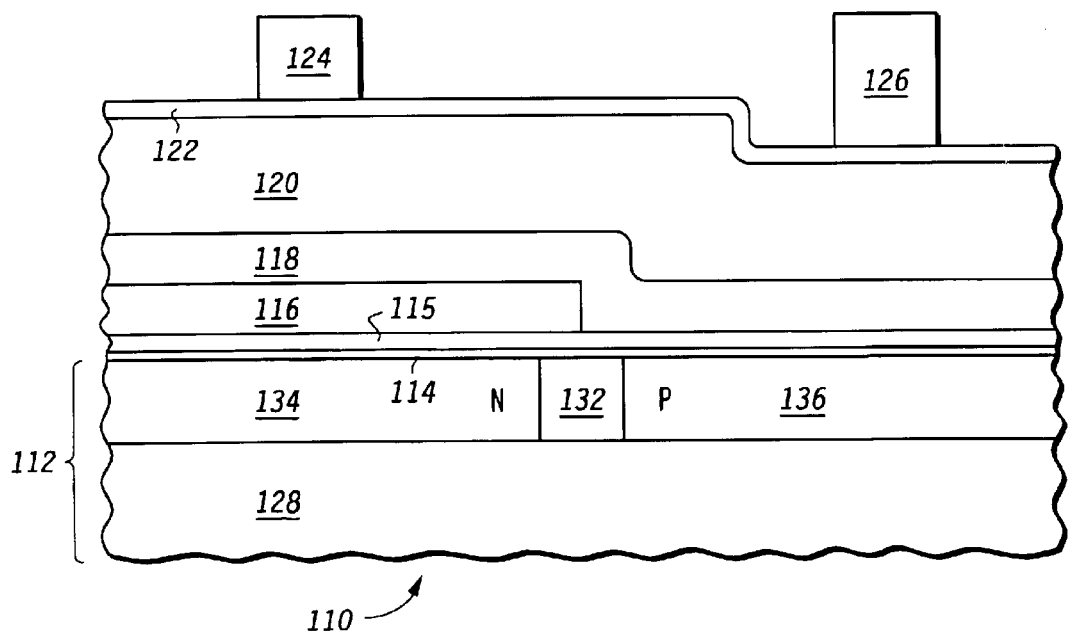
Figure 6:
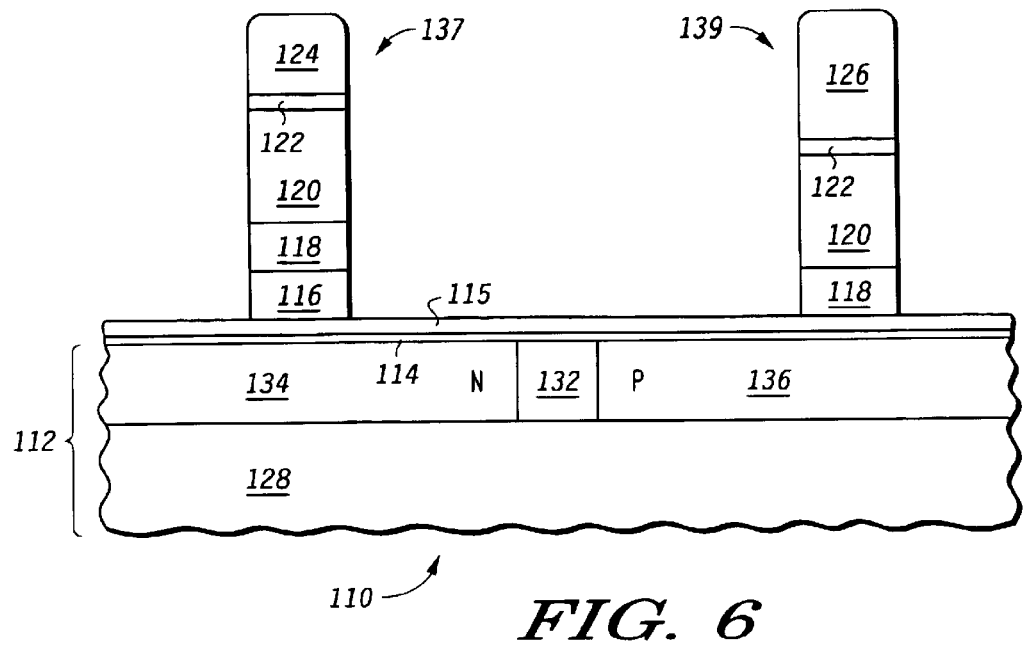

Shown in FIG. 5 is the result of a dry etch process sequence that forms gate stacks 137 and 139 over N region 134 and P region 136, respectively, by removing arc layer 122, polysilicon layer 120, second metal layer 118, and first metal layer 116 everywhere except as covered by patterned photoresist portions 124 and 126. Etch stop layer 115 is exposed everywhere except as covered by gate stacks 137 and 139. As emphasized by the rounded corners and reduced dimensions relative to the features shown in FIG. 4, patterned photoresist portions 124 and 126 may erode during the dry etch processing sequence. Both gate stacks 137 and 139 have portions of ARC 122, polysilicon layer 120, and second metal layer 118 while gate stack 137 also has portions of first metal layer 116.

One embodiment of the dry etch that forms gate stacks 137 and 139 of FIG. 2 includes three phases or steps, which may or may not be carried out in situ (within a single chamber or without breaking vacuum). A first etch step etches silicon nitride ARC layer 122, a second etch step etches polysilicon layer 120, while a third etch step etches the second metal layer 118. Each of these etch steps may be achieved with a halogen-based RIE process. The halogen-based RIE etches vary somewhat and are ultimately determined experimentally based on the actual layers being etched. Etch processes for each of these materials are conventionally known. In one embodiment, the duration of the third etch step described above for second metal layer 118 may be extended until the underlying first metal layer 116 (over N regions 134 of substrate 112) is also removed. Alternatively, a fourth halogen-based RIE etch process, optimized for etching first metal layer 116, is performed.

The presence of etch stop layer 115 according to the present invention greatly simplifies the dual gate etch processing. In the absence of etch stop layer 115, great care would be required to prevent the third (and/or fourth) dry etch processes from etching through layers 118, 116, and gate dielectric 114 and undesirably etching or gouging the underlying N region 134 and/or P region 136 of substrate 112. This unintended over etch occurs because the first metal etch (such as a titanium nitride etch) is not sufficiently selective to probable embodiments of gate dielectric layer 114, which would include grown or deposited silicon oxide and grown or deposited silicon oxynitride. Although silicon oxynitride has a higher dielectric constant than silicon oxide and is more resistant to the first metal layer halogen-based RIE etch, it is still not sufficiently resistant to prevent the first metal etch from etching completely through portions of gate dielectric layer 114 and etching or gouging the underlying silicon substrate 112. Unfortunately, when this gouging problem does occur, the gouging is typically located in the N or P source/drain regions thereby potentially degrading device performance. If silicon oxide is used as the gate dielectric, the same etch issues are present and, in fact, are even worse because the typical dry etch for metal-containing materials such as those used for layers 116 and 118 is even less selective to silicon oxide than to silicon oxynitride. Thus, the presence of etch stop layer 115 enables the manufacturing process to include the use of conventional RIE etch processes to etch first metal layer 116 without jeopardizing the performance of the resulting device by etching through the gate dielectric and gouging the underlying substrate.

For the remainder of this disclosure, it is assumed that the first metal layer 116 is titanium nitride, the second metal layer 118 is tantalum silicon nitride, and etch stop layer 115 is a metal oxide compound such as hafnium oxide. The thickness of titanium nitride layer 116 is desirably thin for processing purposes but is also desirably thick to be deterministic of the work function that controls the channel of the subsequently formed transistor. Gate dielectric layer 114 preferably has a dielectric constant that is greater than 3.9. The optimum work function for N channel transistor gates and P channel transistor gates is generally considered to be at the silicon energy band edges, i.e., 4.1 electron volts (eV) and 5.2 eV, respectively. This is true for both bulk silicon and for partially depleted SOI. In practice this may be difficult to achieve, but preferably the N channel metal gate should have a work function of less than or equal to 4.4 eV and the P channel metal gate should have a work function of more than 4.6 eV for a partially depleted SOI substrate or bulk semiconductor substrate, which is the present case.

Layer 116 of titanium nitride has a work function of 4.65 eV, and layer 118 of tantalum silicon nitride has a work function of 4.4 eV. A lesser work function differential may be satisfactory for fully depleted SOI substrates.

Figure 7:
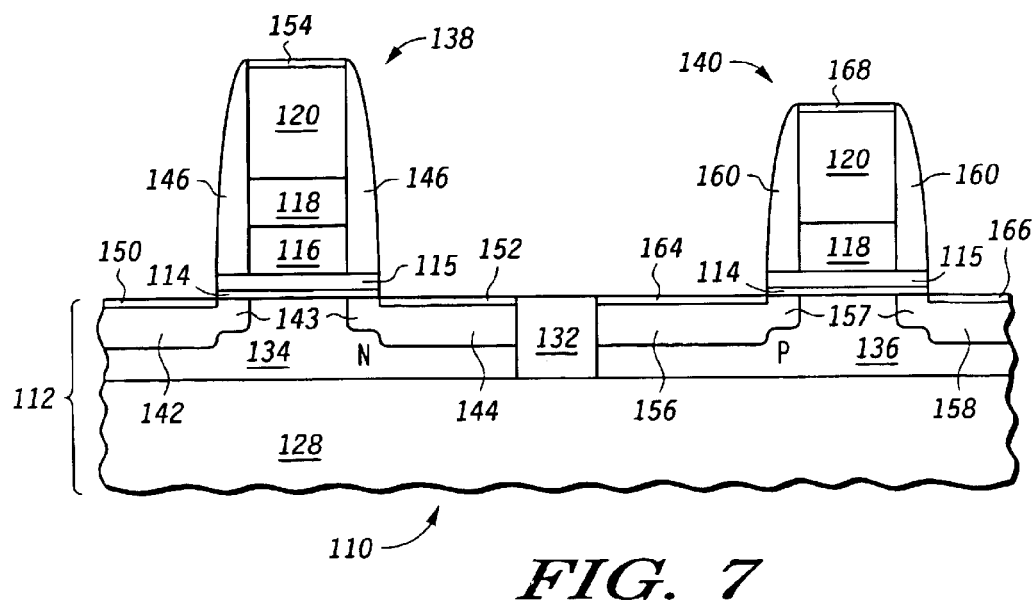

Shown in FIG. 7 are completed transistors 138 and 140 using gate stacks 137 and 139. Patterned photoresist portions 124 and 126 and ARC layer 122 have been removed from gate stacks 137 and 139. Transistor 138 is a P channel transistor having source/drains 142 and 144 including extension or lightly doped regions 143, a dielectric sidewall spacer and/or liner 146, and silicide regions 150, 152, and 154. Silicide regions 150 and 152 are formed over and in contact with source/drains 142 and 144, respectively. Similarly, silicide region 154 is formed over and in contact with the portion of polysilicon layer 120 that is part of the gate stack of transistor 138. Transistor 140 is an N channel transistor having source/drain regions 156 and 158 including extension or lightly doped regions 157, a dielectric sidewall spacer and/or liner 160, and silicide regions 164 and 166. Silicide regions 164 and 166 are on and in contact with source/drains 156 and 158, respectively. Also, silicide region 168 is formed over and in contact with a portion poly layer 120 that is part of the gate stack of transistor 140 as shown in FIG. 7.

Source/drain regions 142, 144, 156, and 158 and extension regions 143 and 157 are preferably formed using ion implantation as is well known. During one or more of these implants, it is generally desirable to protect the substrate from damage by providing a relatively thin film, over the implanted region, that is subsequently removed. In one embodiment of the invention, it is desirable to remove etch stop layer 115 prior to any source/drain implant. Specifically, in an embodiment of etch stop layer 115, such as a hafnium oxide embodiment, containing a metal, removal of exposed portions of etch stop layer 115 prior to implant prevents the metal elements present in etch stop layer 115 from being "knocked" into the underlying substrate during implant. Removal of a hafnium oxide embodiment of etch stop layer 115 is achieved by exposing the film to a HCl gas maintained at a temperature of less than 1000° C. and preferably in the range of approximately 600 to 650° C. In an embodiment, such as the embodiment depicted in FIG. 5, where etch stop layer 115 is formed over gate dielectric 114, the process sequence may include the exposure to heated HCl as described to remove etch stop layer 115 followed directly by extension and/or source/drain implanting since the already-present gate dielectric film 114 may serve as the implant protection layer. In embodiments where etch stop layer 115 underlies gate dielectric 114, removal of etch stop layer 115 using heated HCl prior to extension and source/drain implants necessarily requires the removal of the overlying gate dielectric 114. In this situation, the substrate is exposed following removal of etch stop layer 115 and a subsequent oxide deposition is performed to provide the implant protection layer.

In the foregoing specification, the invention has been described with reference to specific embodiments. However, one of ordinary skill in the art appreciates that various modifications and changes can be made without departing from the scope of the present invention as set forth in the claims below. For example, an alternative to the device structure shown in FIG. 1 is for the overlying conductor to itself be layered or be an alloy with a graded concentration of one of the materials. Also the first and second metal layers 116 and 118 may be different materials than those specified herein. These two layers can actually be of the same materials but having different ratios of those materials in order to achieve the desired work function differential. Further second metal layer 118 can be deposited first so that first metal layer 116 is over layer 118 in the P region 136 area. The result would be that the N channel transistor gate stack would have both metals instead of the P channel gate stack having both metal layers as shown in FIGS. 2–6. Another example of an alternative is to replace the overlying polysilicon layer with a material having a lower sheet resistance such as tungsten. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a dual metal gate structure, comprising:
   providing a semiconductor substrate having a first region and a second region, wherein the first region has a first conductivity type and the second region has a second conductivity type, different from the first conductivity type;
   forming a dielectric layer overlying the first region and the second region of the semiconductor substrate;
   forming an etch stop layer overlying the first and second regions;
   forming a first metal-containing layer overlying the dielectric layer and the etch stop layer, wherein the first metal-containing layer overlies the first region of the semiconductor substrate;
   forming a second metal-containing layer overlying the first metal-containing layer, the dielectric layer, and the etch stop layer;
   forming a patterned masking layer overlying the second metal-containing layer; and
   dry etching the first and second metal-containing layers using the patterned masking layer to form a first gate electrode over the first region and a second gate electrode over the second region.

2. The process of claim 1, wherein one of the first and second metal-containing layers has a work function of at least 4.6 electron volts (eV) and the other one of the first and second metal-containing layers has a work function of at most 4.4 eV.

3. The process of claim 1, wherein one of the first and second metal-containing layers comprises titanium nitride (TiN) and another one of the first and second metal-containing layers comprises tantalum silicon nitride (TaSiN).

4. The process of claim 3, wherein the etch stop layer comprises hafnium oxide.

5. The process of claim 4, wherein the dielectric layer comprises silicon oxynitride.

6. The process of claim 5, wherein the first metal-containing layer is TiN, the second metal-containing layer is TaSiN, the first conductivity type of the first substrate region is N-type, and second conductivity type of the second substrate region is P-type.

7. The process of claim 6 wherein the TaSiN overlies the first and second substrate regions.

8. The process of claim 7, further comprising:
forming a silicon-containing layer overlying the second metal-containing layer, wherein the patterned masking layer overlies the silicon-containing layer;
dry etching the silicon-containing layer using the patterned masking layer;
forming an anti-reflective coating (ARC) layer overlying the silicon-containing layer, wherein the patterned masking layer overlies the ARC layer, and
dry etching the ARC layer using the patterned masking layer.

9. The process of claim 8, further comprising:
forming doped regions in the first and second regions of the semiconductor substrate, adjacent the first and second gate stacks, and forming sidewall spacers adjacent the first and second gate stacks to form a first transistor and a second transistor.

10. The process of claim 1, wherein the gate dielectric layer is formed in direct contact with the substrate and the etch stop layer is formed directly on the gate dielectric layer.

11. The process of claim 10, wherein the gate dielectric is thermally grown.

12. The process of claim 1, where the etch stop layer is formed in direct contact with the substrate and the gate dielectric layer is formed directly on the etch stop layer and wherein the gate dielectric layer is a deposited film.

13. The processing of claim 1, wherein the dielectric layer comprises a dielectric having a dielectric constant (K) of at least 3.9.

14. The process of claim 1, wherein the etch stop layer comprises a material selected from a metal oxide, metal silicate, and metal aluminate.

15. A process for forming a dual metal gate structure, comprising:
forming an etch stop layer and a gate dielectric layer overlying first and second regions of a substrate, the first and second regions having different conductivity types;
forming a first metal-containing layer overlying and in contact with an upper layer of the etch stop layer and the gate dielectric layer over a first region of the substrate;
forming a second metal-containing layer after forming the first metal-containing layer, the second metal-containing layer being in contact with the first metal-containing layer overlying the first region and in contact with the upper layer of the etch stop layer and the gate dielectric layer overlying the second region;
etching the first and second metal-containing layers during formation of first and second gate stacks using at least one halogen-based etchant to etch the first and second metal layers, wherein the etchant is selective to the etch stop layer such that the etch stop layer prevents the etchant from etching into the second region of the substrate.

16. The process of claim 15, wherein the etch stop layer is hafnium oxide, the dielectric layer is silicon oxynitride, the first region is N type, the second region is P-type, the first metal-containing layer is TiN, the second metal containing layer is TaSiN, and the etchant includes chlorine and a fluorine based compound.

17. The process of claim 15, wherein the gate dielectric layer comprises the upper layer of the gate dielectric layer and the etch stop layer.

18. A process for forming a dual metal gate structure comprising:
providing a semiconductor substrate having an N-doped region and a P-doped region;
forming a dielectric layer and etch stop layer overlying the semiconductor substrate;
forming a first gate stack overlying the N-doped region, the first gate stack having a first metal-containing gate electrode overlying and in physical contact with the upper layer of the dielectric layer and etch stop layer wherein forming the first gate stack comprises dry etching a first metal-containing layer to form the first metal-containing gate electrode; and
forming a second gate stack overlying the P-doped region, the second gate stack having a second metal-containing gate electrode overlying and in physical contact with the higher of the dielectric layer and the etch stop layer, wherein forming the second gate stack comprises dry etching a second metal-containing layer to form the second metal-containing gate electrode, and wherein the first metal-containing gate electrode has a first work function and the second metal-containing gate electrode has a second work function, different from the first work function.

19. The process of claim 18, wherein one of the first and second work functions is at least 4.6 eV and another one of the first and second work functions is at most 4.4 eV.

20. The process of claim 18, wherein the etch stop layer is selected from a metal oxide, metal silicate, and metal aluminate.

21. The process of claim 20, wherein the first and metal-containing gate electrodes comprises titanium nitride and the second metal-containing gate electrode comprises tantalum silicon nitride.

22. The process of claim 21, wherein the gate dielectric comprises silicon, oxygen, and nitrogen.

23. The process of claim 22, wherein the gate dielectric is the upper of the gate dielectric layer and the etch stop layer.

24. The process of claim 22, wherein the etch stop layer is the upper of the gate dielectric layer and the etch stop layer.

* * * * *